(12) United States Patent
Supriya et al.

(10) Patent No.: US 8,183,697 B2
(45) Date of Patent: May 22, 2012

(54) APPARATUS AND METHODS OF FORMING AN INTERCONNECT BETWEEN A WORKPIECE AND SUBSTRATE

(75) Inventors: Lakshmi Supriya, Chandler, AZ (US); Anna M. Prakash, Chandler, AZ (US); Tommy Ashton, II, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/956,141

(22) Filed: Nov. 30, 2010

(65) Prior Publication Data
US 2011/0074023 A1    Mar. 31, 2011

Related U.S. Application Data

(63) Continuation of application No. 12/151,063, filed on May 1, 2008, now Pat. No. 7,843,075.

(51) Int. Cl.
*H01L 29/40* (2006.01)
*H01L 21/44* (2006.01)

(52) U.S. Cl. ............... 257/779; 438/612; 257/E23.023; 257/E21.508

(58) Field of Classification Search ................. 438/612; 257/779, E23.023, E21.508
See application file for complete search history.

(56) References Cited

U.S. PATENT DOCUMENTS

| | | | |
|---|---|---|---|
| 7,032,513 B2 | 4/2006 | Onishi et al. | |
| 7,166,491 B2 | 1/2007 | Wilson et al. | |
| 7,592,707 B2 | 9/2009 | Krishnamoorthy et al. | |
| 2003/0013228 A1 | 1/2003 | Hotchkiss et al. | |
| 2007/0246516 A1 | 10/2007 | Cordes et al. | |

*Primary Examiner* — William D Coleman
(74) *Attorney, Agent, or Firm* — Kenneth A. Nelson

(57) ABSTRACT

Embodiments of an apparatus and methods of forming interconnect between a workpiece and substrate and its application to packaging of microelectronic devices are described herein. Other embodiments may be described and claimed.

19 Claims, 3 Drawing Sheets

US 8,183,697 B2

APPARATUS AND METHODS OF FORMING AN INTERCONNECT BETWEEN A WORKPIECE AND SUBSTRATE

CLAIM OF PRIORITY

This application is a continuation of U.S. patent application Ser. No. 12/151,063 (now U.S. Pat. No. 7,843,075), filed on May 1, 2008.

FIELD OF THE INVENTION

The field of invention relates generally to the field of microelectronic devices and, more specifically but not exclusively, relates to semiconductor integrated circuit manufacturing.

BACKGROUND INFORMATION

Microelectronic devices such as integrated circuits, for example, are typically combined with a substrate and assembled in a package that is soldered or connected to a printed circuit board prior to use. One method of connecting an integrated circuit to a substrate is known in the art as controlled collapse chip connection (C4) flip chip manufacturing. Flip chip manufacturing includes an integrated circuit having contact pads (e.g., electric terminals) placed on one side of the die so that it can be flipped over and bonded with adhesive with the contact pads providing an electrical connection with contact bumps on a package substrate. Such adhesives are typically filled with fine silica particles in order to compensate for differences in coefficient of thermal expansion (CTE) between flip chip components.

One form of flip chip manufacturing involves wafer level packaging using lead-free solder to form electrical contacts between the integrated circuit and substrate. Wafer level packaging uses an underfill process to fill voids that may otherwise exist between the integrated circuit and the substrate. Voids between the integrated circuit and substrate weaken the structural integrity of the integrated circuit/substrate interface that may lead to delamination during thermal and/or moisture loading. One problem that may arise in a flip chip manufacturing process using lead free type solder is that the chip connection is either not collapsible or only minimally collapsible, thereby forming large voids between the microelectronic device and substrate when packaged.

BRIEF DESCRIPTION OF THE DRAWINGS

The present invention is illustrated by way of example and not as a limitation in the figures of the accompanying drawings, in which.

DETAILED DESCRIPTION

An apparatus and methods of forming an interconnect between a workpiece and substrate are described in various embodiments. In the following description, numerous specific details are set forth such as a description of a method to package a microelectronic device using a low glass transition temperature ($T_g$) film to minimize or eliminate voids between a substrate and workpiece during a chip attach process.

It would be an advance in the art of wafer level packaging, wherein a workpiece such as a microelectronic device is mounted on a substrate with a flip chip ball grid array, to fill a void between a workpiece (or die) and substrate in wafer level underfill processing. It would also be an advantage to provide a mechanism to deposit a limited amount of flux only on the bumps of a substrate to limit an amount of flux residue left as an artifact of the packaging process. It would be a further advantage to reduce an amount of warpage stress and/or to lower an amount of solder strain in a microelectronic device package by using a package comprising a low glass transition temperature film. These advantages are particularly useful with packages comprising solder bumps formed of materials that are effectively non-collapsible such as copper (Cu) and tin (Sn)/silver (Ag) alloys. Underfill is typically used to fill packaging gaps; however, when the volume between a workpiece or die and substrate is greater than an amount of available underfill, the resulting package may contain voids. Especially in cases where the workpiece or die is configured with underfill pre-loaded on the workpiece or die that is flush with or recessed below the surface of the solder bumps.

One such method involves forming an interconnect between a workpiece and a bumped substrate with an adjoining film. A plurality of indentations are formed in the film and flux is applied to the plurality of indentations to form a flux loaded film. The flux loaded film is placed on the bumped substrate and heated to form flux coated bumps on the bumped substrate. The bumped substrate is reflowed to form the interconnect with the workpiece.

Figure 1:
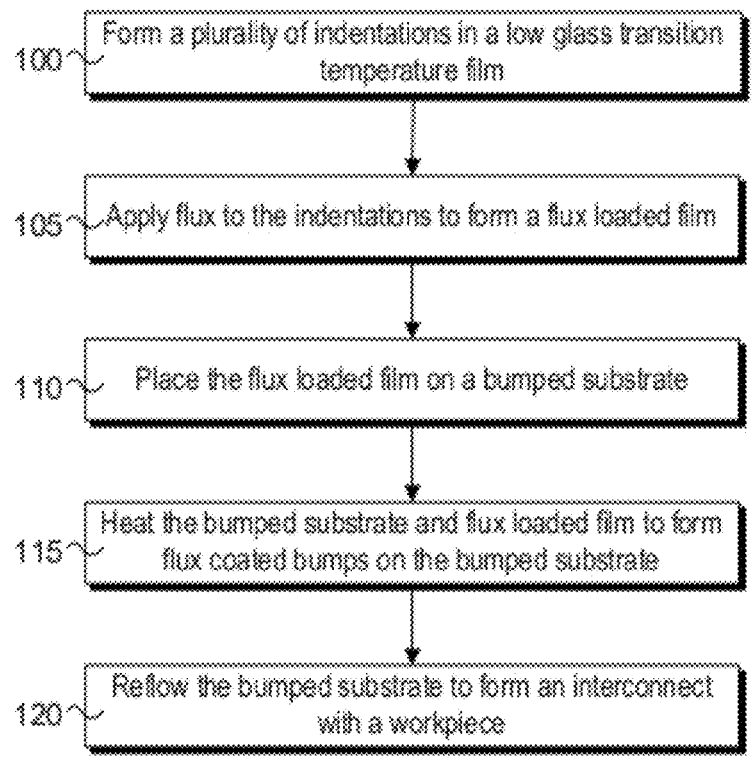
FIG. 1 is a flowchart describing an embodiment of a fabrication process used to form a microelectronic device package.

Turning now to the figures, the illustration in FIG. 1 is a flowchart describing an embodiment of a fabrication process used to form a microelectronic device package. In element 100, a plurality of indentations are formed in a low glass transition temperature ($T_g$) film. The low $T_g$ film may be patterned using an imprinting process, an embossing process or another process used to form a defined set of indentations known to one skilled in the art. The defined set of indentations is designed to interface with a pattern of bumps, either in whole or in part, to be formed on a substrate. The low $T_g$ film is formed of a material that is chemically and physically compatible with wafer level underfill to be used on a workpiece or die. Further, the low $T_g$ film material properties are selected to allow the film material to flow when thermally processed. In one embodiment, the low $T_g$ film will begin to flow when heated in a range approximately between 65 and 100 degrees Celsius (°C.). In another embodiment, the low $T_g$ film will begin to flow when heated in a range between 50 to 180° C. The low $T_g$ film may be formed of a thermoplastic polymer such as polyethylene terephthalate (PET), poly(methyl methacrylate) (PMMA), poly(vinyl alcohol) (PVA), polyvinyl chloride (PVC), high $T_g$ derivatives of polyethylene (PE) or polypropylene (PP), polyacrylate, or polystyrene. In alternate embodiments, the low $T_g$ film may be formed of a low crosslinked thermoset polymer such as an epoxy or a phenol formaldehyde (PF) resin.

Flux is applied to the indentations formed in element 100 to form a flux loaded film in element 105. The flux may be applied using one or more methods known to one skilled in the art including spraying, printing and spin-coating. Flux may be removed from areas surrounding the indentations using a squeegee, another removal device, or an erosion process. The flux is a low residue material comprising an activator and a solvent. The solvent may be selected from a group of alcohols comprising slow evaporating solvents propylene/ethylene glycol ethers and acetates, diethers (diglyme), (ex propylene glycol methyl ether, tripropylene glycol methyl ether, di-ethylene glycol n-butyl ether, dipropylene glycol methyl ether, ethylene glycol n-butyl ether, diethylene glycol n-butyl ether, diethylene glycol methyl ether), primary amyl acetate, cellosolve acetate, diisobutyl ketone, diacetone alcohol, butyl cellosolve, butyl cellosolve acetate, glycol diacetate, carbitol acetate, butyl carbitol acetate. Additionally, the solvent may be an azeotrope of a mixture of the group of alcohols or other solvents.

The flux loaded film is placed on a bumped substrate in element 110. By "bumped substrate," what is meant in the context of the instant description is a substrate onto which microelectronic conductive patterns have been provided to carry electrical current and/or signals through an array of solder bumps formed on one or more sides of the substrate. Each solder bump is separated from other solder bumps by a gap to prevent a direct electrical connection between two or more solder bumps. The bumped substrate may include either the substrate of a completed microelectronic device, or a substrate adapted to be further processed to form a microelectronic device, or a substrate, such as a printed wiring board, including conductive patterns adapted to provide interconnection between microelectronic components. For example the substrate can be an organic substrate, a ceramic substrate, or a semiconductor substrate, such as a silicon substrate of a microelectronic die.

The flux loaded film with the defined set of indentations is placed on the bumped substrate so that bumps on the bumped substrate are covered with flux from the flux loaded film when the bumps are seated in the indentations. For purposes of this application, the bumps may be seated when the bumps are in contact with the flux loaded film while the substrate is in direct contact with the low $T_g$ film. In another embodiment, the bumps may be seated when the bumps are in contact with the flux loaded film and a portion or all of the low $T_g$ film is positioned above the substrate, but not in direct contact with the substrate.

In element 115, the bumped substrate and the flux loaded film are heated to form flux coated bumps on the bumped substrate. The bumped substrate and the flux loaded film are heated to a temperature at or above a low glass transition temperature for the flux loaded film using one or more heat transfer methods including conduction, convection, and/or radiation heat transfer. In one embodiment, the bumped substrate and the flux loaded film are heated in an oven to fill gaps between the bumps with the low $T_g$ film while providing a layer of flux on the bumps. The flux coated bumps may then be reflowed by melting or thermally treating, using a selectively designed thermal process to reflow flux coated bumps comprising a solder, to form an interconnect with a workpiece in element 120. In another embodiment, the flux coated film may be combined with the bumped substrate and the workpiece using a chip attach process. In this embodiment, the bumped substrate, flux loaded film, and workpiece are heated to a temperature at or above a low glass transition temperature for the flux loaded film to melt the flux loaded film, activate the flux, and to form the interconnect between the bumped substrate and the workpiece.

Figure 2:
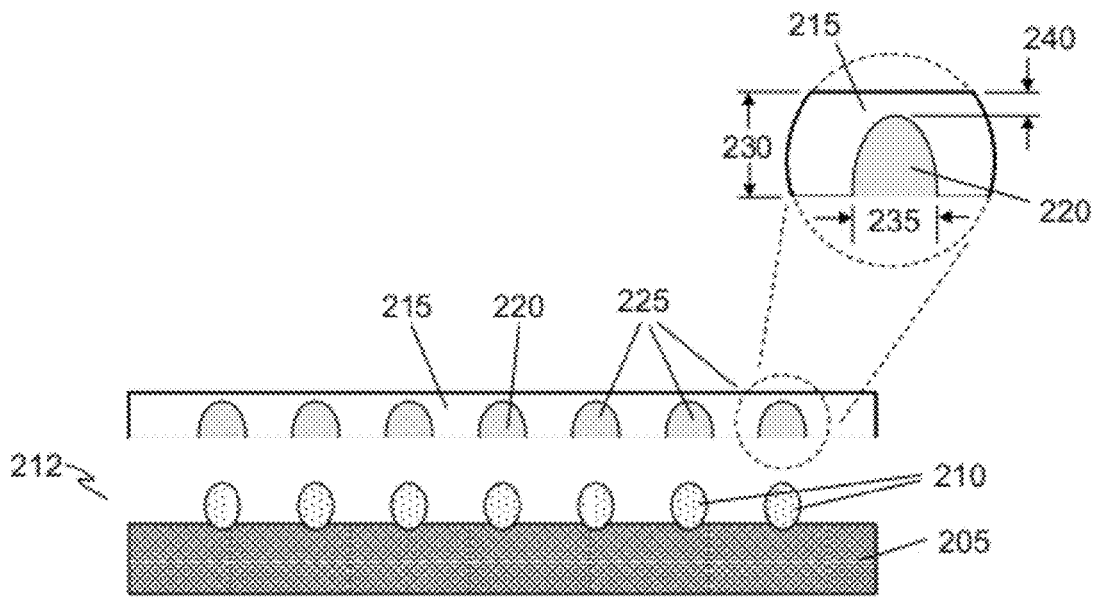
FIG. 2 is an illustration of a bumped substrate and a low glass transition temperature film with flux loaded indentations situated above the bumped substrate.

Turning now to FIG. 2, this embodiment represents an intermediate cross-section of an apparatus formed when preparing a bumped substrate for packaging with a workpiece. In this embodiment, that apparatus includes substrate 205 with a plurality of solder bumps 210 formed on the substrate 205 to provide a bumped substrate 212. Also, a low $T_g$ film 215 with flux 220 loaded in a plurality of flux coated indentations 225 is positioned above the bumped substrate 212. In this embodiment, the flux 220 completely fills the flux coated indentations 225. However, the flux 220 may only coat the surface of the flux coated indentations 225 thereby forming a thin coating of flux 220 along the surface of the flux coated indentation 225 without filling an entire volume of the flux coated indentation 225.

The substrate 205 is formed of a material comprising one or more ceramic, organic, and semiconductor materials. The solder bumps 210 are formed using one or more materials that are effectively non-collapsible such as Cu and Sn/Ag alloys. In another embodiment, the solder bumps 210 are formed of another fusible metal alloy comprising tin, copper, silver, bismuth, indium, zinc, and/or antimony. A flux coated indentation 225 is expanded in FIG. 2 to illustrate a low $T_g$ film thickness 230 with an indentation width 235 and an indentation wall thickness 240. In one embodiment, the low $T_g$ film thickness 230 ranges approximately between 1 and 150 microns (μm), though the embodiment is not so limited as the low $T_g$ film thickness 230 selected would be scaled to accommodate the solder bumps 210. Accordingly, the indentation width 235 ranges approximately between 20 and 500 μm depending on the size of the solder bumps 210. The wall thickness 240 is selected to allow the low $T_g$ film 215 to flow over and expose the solder bump 210 to provide a layer of flux 220 over the exposed solder bumps 210, as later illustrated in FIG. 4. In one embodiment, the indentation wall thickness 240 is approximately one μm or greater.

Figure 3:
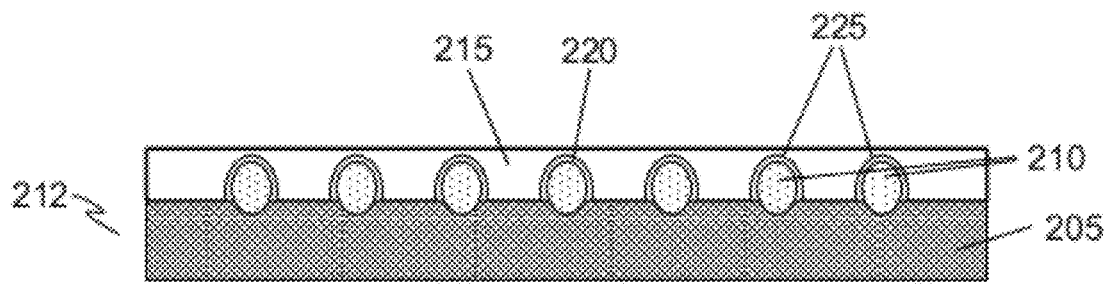
FIG. 3 is an illustration of the bumped substrate and film of FIG. 2 with the low glass transition temperature film positioned adjacent to the bumped substrate.
Figure 4:
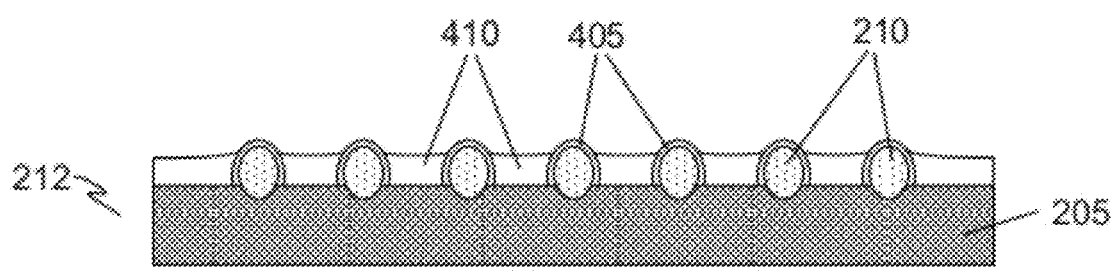
FIG. 4 is an illustration of the bumped substrate and film of FIG. 3 after heating the substrate and film to expose flux layered bumps above a top surface of the film.

FIG. 3 is an illustration of the bumped substrate 212 and low $T_g$ film 215 of FIG. 2 with the low $T_g$ film 215 positioned adjacent to the bumped substrate 212. In this embodiment, the solder bumps 210 are seated in the flux coated indentations 225 to expose the solder bumps 210 to flux 220 and the substrate 205 is in direct contact with the low $T_g$ film 215. FIG. 4 is an illustration of the bumped substrate 212 and low $T_g$ film 215 of FIG. 3 after exposing the bumped substrate 212 and/or low $T_g$ film 215 to an electromagnetic or thermal energy source to expose flux layered solder bumps 405 above a thermally modified low $T_g$ film 410. In one embodiment, the bumped substrate 212 and the low $T_g$ film 215 are heated to a temperature at or above a low glass transition temperature for the flux loaded film using one or more heat transfer methods including conduction, convection, and/or radiation heat transfer. For example, the bumped substrate 212 and/or the low $T_g$ film 215 are heated to a range approximately between 65° C. and 100° C. to form the thermally modified low $T_g$ film 410 and the flux layered solder bumps 405. As another example, the bumped substrate 212 and/or the low $T_g$ film 215 are heated to a range approximately between 50 and 180° C. The thermally modified low $T_g$ film 410 is heated to or above its glass transition temperature to flow and fill spaces and/or gaps between the flux layered solder bumps 405 on the substrate 205 while providing a desired thickness of underfill material for packaging.

Figure 5:
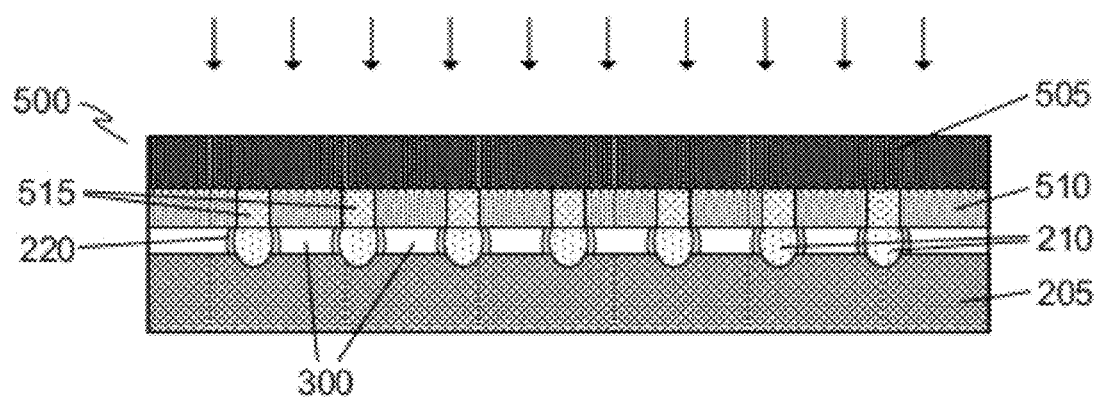
FIG. 5 is an illustration of the heated bumped substrate and film of FIG. 4 with a workpiece positioned adjacent to the bumps and film to form an interconnect.

FIG. 5 is an illustration of the bumped substrate 212 and thermally modified low $T_g$ film 410 of FIG. 4 with a workpiece 500 positioned adjacent to the flux layered solder bumps 405 and thermally modified low $T_g$ film 410 to form an interconnect between a microelectronic device 505 and the substrate 205. The workpiece 500 may comprise a microelectronic device 505 with a die including integrated circuitry and a plurality of bond-pads 515 that are coupled to the integrated circuitry. In this embodiment, the bond-pads 515 are separated from one another with wafer level underfill 510, wherein the wafer level underfill 510 is selectively designed to enhance solder joint reliability and overall reliability of the packaging by redistributing thermal and mechanical stresses in a packaged microelectronic device.

Figure 6:
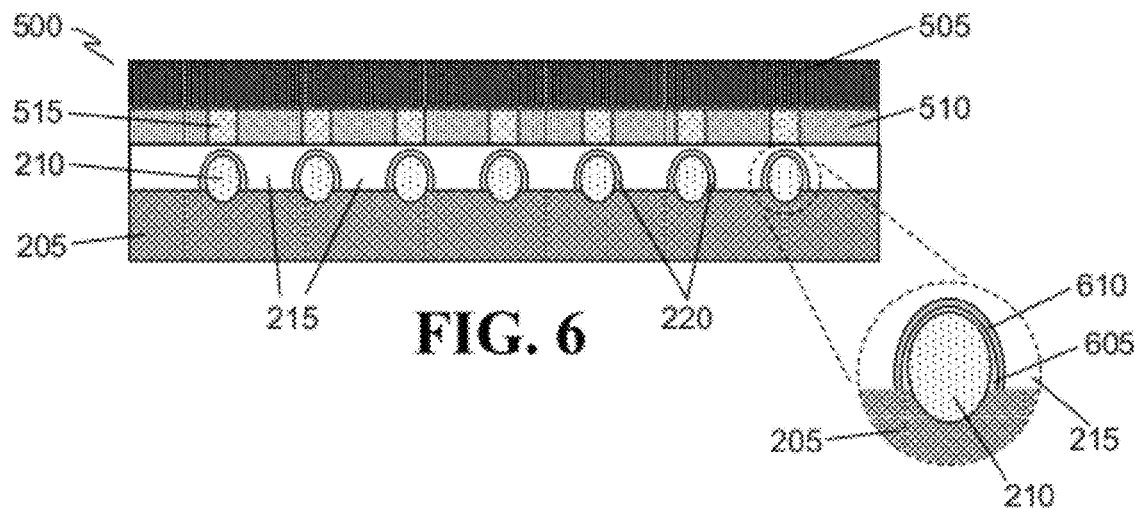
FIG. 6 is an illustration of the bumped substrate and film of FIG. 3 with a workpiece positioned adjacent to the bumps and film.

FIG. 6 is an illustration of the bumped substrate 212 and the low $T_g$ film 215 of FIG. 3 with a workpiece 500 positioned adjacent to the solder bumps 210 and the low $T_g$ film 215. The illustration of FIG. 6 presents an alternate embodiment to the packaging methodology illustrated in FIG. 4 and FIG. 5. The embodiment of FIG. 6 illustrates the substrate 205 placed adjacent to the low $T_g$ film 215 and the microelectronic device 505 with the wafer level underfill 510 and the bond-pads 515 prior to exposing the bumped substrate 212, low $T_g$ film 215, and/or the workpiece 500 to an electromagnetic or thermal energy source known to one skilled in the art. As an alternate embodiment, the solder bumps 210 are coated with a flux film 605 formed adjacent to a solder paste film 610. In this alternate embodiment, a solder paste is first printed on the low $T_g$ film 215 so that each indentation has a first layer of solder before a layer of flux 220 is applied to the first layer of solder. One benefit to this alternate embodiment is that the solder paste film 610 helps to remove the low $T_g$ film 215 from an upper portion of the solder bumps 210 during the assembly process, thereby improving the interconnect between the substrate 205 and the microelectronic device 505.

Figure 7:
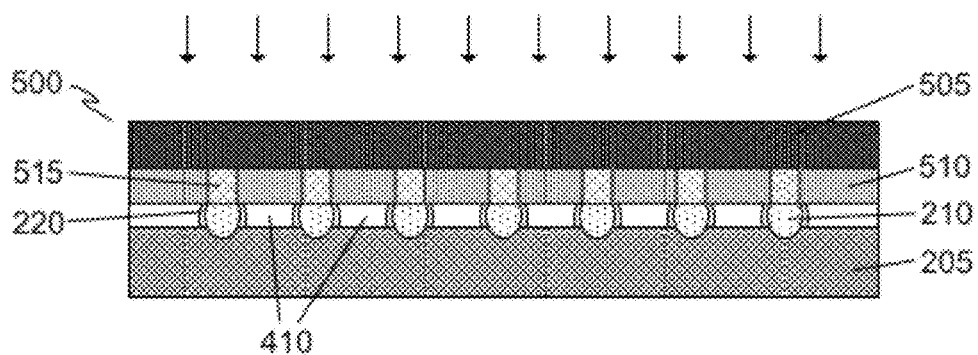
FIG. 7 is an illustration of the bumped substrate, film, and workpiece of FIG. 6 after heating the bumped substrate, film, and workpiece to form an interconnect.

FIG. 7 is an illustration of the substrate 205, the low $T_g$ film 215, and workpiece 500 of FIG. 6 after heating the substrate 205, the low $T_g$ film 215, and workpiece 500 to form an interconnect between the substrate 205 and the microelectronic device 505. In one example, the substrate 205, the low $T_g$ film 215, and workpiece 500 are heated to a range approximately between 65° C. and 100° C. to form the thermally modified low $T_g$ film 410. In another example, the substrate 205, the low $T_g$ film 215, and workpiece 500 are heated to a range approximately between 50 and 180° C. The thermally modified low $T_g$ film 410 is heated to or above its glass transition temperature to flow and fill spaces and/or gaps between the substrate 205 and the workpiece 500 while providing a desired thickness of underfill material for packaging.

A plurality of embodiments of an apparatus and methods for forming an interconnect between a workpiece 500 and a substrate 205 have been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming an interconnect structure, the method comprising:
providing a substrate having an electrically conductive terminal thereon and providing a die having an electrically conductive structure attached thereto, wherein the electrically conductive terminal has an interfacing surface on which a flux is present;
heating the substrate and the flux in order to coat the electrically conductive terminal with the flux, thereby forming a flux-coated electrically conductive terminal;
reflowing the flux-coated electrically conductive terminal in order to form the interconnect structure between the substrate and the electrically conductive structure attached to the die; and depositing an underfill material between the die and the substrate.

2. The method of claim 1 wherein:
the flux is present on the interfacing surface of the electrically conductive terminal by virtue of a procedure comprising:
    forming a plurality of indentations in a low glass transition temperature film;
    applying flux to the indentations in order to form a flux loaded film; and
    placing the flux loaded film on the substrate over the electrically conductive terminal.

3. The method of claim 2, wherein a glass transition temperature of the low glass transition temperature film is between 50 and 180 degrees Celsius.

4. The method of claim 2, wherein the low glass transition temperature film comprises a polyester.

5. The method of claim 2, wherein the low glass transition temperature film comprises a thermoplastic polymer.

6. The method of claim 2, further including applying a solder paste film to the low glass transition temperature film.

7. The method of claim 2, wherein a thickness of the low glass transition temperature film ranges approximately between 1 and 150 microns.

8. A semiconductor apparatus comprising:
    a package substrate comprising electrically conductive terminals;
    a material having a glass transition temperature between 50 and 180 degrees Celsius forming part of the electrically conductive terminals;
    an underfill material adjacent to the low glass transition temperature material; and
    a microelectronic device comprising a plurality of electrically conductive structures, wherein the microelectronic device is connected to the package substrate through the electrically conductive structures and the electrically conductive terminals.

9. The semiconductor apparatus of claim 8, further comprising a flux and a solder paste adjacent to the low glass transition temperature material.

10. The apparatus of claim 8, wherein the solder bumps on the substrate comprise copper.

11. The apparatus of claim 8, wherein a thickness of the low glass transition temperature material ranges approximately between 1 and 150 microns.

12. The apparatus of claim 8, wherein the low glass transition temperature film material is a thermoplastic polymer.

13. The apparatus of claim 8, wherein the low glass transition temperature film material is an epoxy.

14. A semiconductor apparatus comprising:
    a package substrate comprising electrically conductive terminals;
    a low glass transition temperature material adjacent to the electrically conductive terminals;
    an underfill material adjacent to the low glass transition temperature material; and
    a microelectronic device comprising a plurality of electrically conductive structures, wherein the microelectronic device is connected to the package substrate through the electrically conductive structures and the electrically conductive terminals.

15. The semiconductor apparatus of claim 14, further comprising a flux and a solder paste adjacent to the low glass transition temperature material.

16. The apparatus of claim 14, wherein the solder bumps on the substrate comprise copper.

17. The apparatus of claim 14, wherein a thickness of the low glass transition temperature material ranges approximately between 1 and 150 microns.

18. The apparatus of claim 14, wherein the low glass transition temperature film material is a thermoplastic polymer.

19. The apparatus of claim 14, wherein the low glass transition temperature film material is an epoxy.

* * * * *